(12) United States Patent
Minotti et al.

(10) Patent No.: US 8,513,811 B2
(45) Date of Patent: Aug. 20, 2013

(54) ELECTRONIC DEVICE AND METHOD FOR CONNECTING A DIE TO A CONNECTION TERMINAL

(75) Inventors: Agatino Minotti, Catania (IT); Giuseppe Cristaldi, Catania (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 15 days.

(21) Appl. No.: 13/117,340

(22) Filed: May 27, 2011

(65) Prior Publication Data

US 2011/0291286 A1 Dec. 1, 2011

(30) Foreign Application Priority Data

May 28, 2010 (IT) ................ TO2010A0448

(51) Int. Cl.
*H01L 23/52* (2006.01)
*H01L 21/60* (2006.01)
*H01L 23/495* (2006.01)

(52) U.S. Cl.
USPC ............ 257/773; 257/E23.141; 257/E21.506; 257/E23.044; 257/E23.052; 257/E23.054; 257/691; 257/670; 257/666; 257/782; 257/672; 257/735

(58) Field of Classification Search
USPC ................. 257/773, E23.141, E21.506, 691, 257/E23.044, E23.052, 670, 666, 782, 672, 257/735, E23.054
See application file for complete search history.

(56) References Cited

U.S. PATENT DOCUMENTS

| | | | | |
|---|---|---|---|---|
| 6,528,880 B1* | 3/2003 | Planey | ........................ | 257/735 |
| 7,443,018 B2* | 10/2008 | Ong et al. | .................... | 257/692 |
| 7,560,809 B2* | 7/2009 | Nakajima | ..................... | 257/692 |
| 7,745,253 B2* | 6/2010 | Luechinger | ................... | 438/106 |
| 8,138,585 B2* | 3/2012 | Liu et al. | ........................ | 257/675 |
| 8,237,268 B2* | 8/2012 | Otremba et al. | .............. | 257/734 |
| 8,252,632 B2* | 8/2012 | Yato et al. | .................... | 438/118 |
| 2005/0275082 A1* | 12/2005 | Ferrara et al. | ................ | 257/691 |
| 2012/0149149 A1* | 6/2012 | Liu et al. | ...................... | 438/107 |

* cited by examiner

*Primary Examiner* — A O Williams
(74) *Attorney, Agent, or Firm* — Wolf, Greenfield & Sacks, P.C.

(57) ABSTRACT

An electronic device including a die-pad area, a die fixed to the die-pad area, a connection terminal, and a ribbon of conductive material. The ribbon is electrically connected to the die and to the connection terminal, and has a prevalent dimension along a first axis, a width, measured along a second axis, which is transverse to the first axis, and a thickness, which is negligible with respect to the width; the ribbon moreover has a cross section that defines a concave geometrical shape.

28 Claims, 3 Drawing Sheets

ELECTRONIC DEVICE AND METHOD FOR CONNECTING A DIE TO A CONNECTION TERMINAL

CROSS REFERENCE TO RELATED APPLICATIONS

This application claims the priority benefit of Italian patent application number TO2010A 000448, filed on May 28, 2010, entitled ELECTRONIC DEVICE AND METHOD FOR CONNECTING A DIE TO A CONNECTION TERMINAL, which is hereby incorporated by reference to the maximum extent allowable by law.

BACKGROUND OF THE INVENTION

1. Field of the Invention

The present invention relates to an electronic device and method for connecting a die to a connection terminal. In particular, the invention regards a ribbon-bonding method.

2. Discussion of the Related Art

As is known, in the technical field of packaging of integrated electronic circuits, there is felt the need to connect electrically dies and connection terminals (also known as posts) by means of bonds that introduce low values of resistance, and withstand, without melting, the passage of high currents, in the region of 150-200 A. This need is particularly felt in the case of so-called power packages, which are commonly used for packaging integrated circuits that form devices with high current consumption, such as, for example, power diodes, low-voltage power MOSFETs, or insulated-gate bipolar transistors (IGBTs).

As is known, in order to bond a die to a connection terminal, commonly used today are the so-called wire-bonding, clip-bonding, and ribbon-bonding techniques.

By way of example, FIG. 1 is a schematic illustration of a package 1, which is formed by a die-pad area 2 of metal material and having the function of carrying a die 4, which provides a mechanical support to the die 4 itself; in particular, the die 4 is connected to the die-pad area 2 by means of an appropriate bonding paste, and is protected by a protective case (not shown), made of insulating material and forming part of the package 1. In addition, the package 1 comprises three leads 6, which enable connection of the die 4 to the outside world, and form, together with the die-pad area 2, the so-called lead frame 8. The package 1 further comprises a tab 10, which is made of metal material, is connected to the die-pad area 2, and defines a fixing hole 12.

In greater detail, each of the leads 6 has a respective connection terminal 14. By way of example, the connection terminals of two leads 6 set externally have a so-called "T" shape, so that they are generally known as "T-posts".

Operatively, to enable proper operation of the die 4 and of the electronic circuits implemented therein, it is necessary to bond the die 4 itself with one or more of the leads 6. For this purpose, it is possible to resort, amongst other techniques, to the aforementioned wire bonds, clip bonds, or ribbon bonds.

As regards wire bonding, it is likewise possible to distinguish between thin-wire bonding and heavy-wire bonding; in either case, the bonding is carried out by means of an element of conductive material, having a circular section.

In the case of clip bonding, the bond is carried out by means of a so-called clip, i.e., a strip of conductive material (typically, copper), so as to obtain a quasi-planar bonding.

As regards, instead, ribbon bonding, bonding between the die 4 and at least one of the leads 6 is carried out using a sort of ribbon of conductive material, typically aluminum.

By way of example, FIG. 2 shows an example of ribbon bonding, inside an electronic device 15 formed by a die, designated once again by 4, and a respective package, designated once again by 1. Further elements, already shown in FIG. 1 and present also in the electronic device 15 shown in FIG. 2 are designated by the same reference numbers. For reasons of clarity, the protective case of the die 4 is not shown in FIG. 2 either.

In particular, the electronic device 15 comprises a first connection terminal 14a, a second connection terminal 14b, and a third connection terminal 14c, which respectively form part of a first connector 6a, a second connector 6b, and a third connector 6c; in addition, the electronic device 15 comprises a ribbon 16, made for example of aluminum, or else of aluminum-cladded copper.

In detail, the ribbon 16 is electrically connected to the first connection terminal 14a and to the die 4. In particular, the die 4 has a body 17, made of semiconductor material, and a metallization 18, which is set in contact with the body 17 and defines a top surface 20 of the die 4 itself. In addition, the ribbon 16 is electrically connected to the metallization 18 of the die 4, while a bottom surface 22 of the die 4, opposite to the top surface 20, is connected to the die-pad area 2 by means of a layer of bonding paste (not shown). In practice, the metallization 18, made, for example, of aluminum, defines the so-called front die, which is electrically connected to the first connection terminal 14a by means of the ribbon 16.

In greater detail, the ribbon 16 has a certain flexibility and has a first contact surface 24a, a second contact surface 24b, and a third contact surface 24c, which are to a first approximation the same as one another and substantially rectangular in shape. In particular, the first contact surface 24a is formed by the portion of the ribbon 16 effectively in contact with the first connection terminal 14a, while the second and third contact surfaces 24b, 24c are formed by portions of the ribbon 16 effectively in contact with the metallization 18 of the die 4.

The electronic device 15 likewise comprises a wire bond 26, which electrically connects the third connection terminal 14c to the die 4. In particular, the metallization 18 is shaped so that the wire bond 26 is electrically connected not to the metallization 18, but rather to the body 17 of the die 4. The second connection terminal 14b is, instead, formed integrally with the die-pad area 2, as well as with the tab 10.

Purely by way of example, the die 4 can house a power MOSFET 27, and the first, second, and third connection terminals 14a-14c can be electrically connected, respectively, to the source, drain, and gate terminals of the power MOSFET 27; in this case, the metallization 18 coincides electrically with the source terminal, whilst the die-pad area 2 coincides electrically with the drain terminal.

FIG. 3 shows a cross section of the ribbon 16, which has a rectangular shape and a width L and a thickness T. The thickness T is negligible with respect to the length (not shown) and to the width L of the ribbon 16; in particular, the thickness T is not greater than one third of the width L.

In general, the ribbon bonds are characterized by low resistances, and enable supply to the dies, or rather to the electronic circuits formed therein, of particularly high currents, hence representing a very flexible form of connection suitable also in the case of so-called power devices.

In greater detail, the ribbons designed to form the ribbon bonds are generally obtained by means of rolling of a conductive material (aluminum, cladded copper, etc.) into sheets having a thickness T; next, the sheets are cut in such a way that the ribbons thus obtained have the desired widths L. From a more quantitative standpoint, the ribbons available today typically have thicknesses T and widths L that are in a ratio with respect to one another of one to ten, or else of one to eight. In absolute terms, the maximum thickness $T_{max}$ and the maximum width $L_{max}$ of a generic ribbon are, respectively, equal to 10×80 mils, i.e., 0.254×2.032 mm.

In practice, in the technical field of packages of integrated electronic circuits, the ribbon bonds are obtained using ribbons the thickness T and width L of which are substantially standardized, according to the machines currently available for creating the bonds themselves, generally known as bonding machines. In particular, the aforementioned maximum width $L_{max}$ is set by the bonding machines currently available for providing wire bonds. In fact, it is common practice to use the same bonding machines to carry out both wire bonding and ribbon bonding; however, this is possible provided that the ribbons have widths not greater than the maximum width $L_{max}$; otherwise, the bonding machines known today do not enable handling of ribbons in an appropriate way.

In detail, a generic bonding machine comprises, amongst other things, one or more guides, a bonding tool and a transducer. In practice, the guides are such as to bring a wire, in the case of wire bonds, or else a ribbon, in the case of ribbon bonds, in the proximity of at least one die, carried by a respective die-pad area. When the wire, or else the ribbon, is in the proximity of the aforementioned die, the connection tool exerts a pressure on the wire/ribbon, in such a way that it contacts the die, and in particular the metallization that forms the front die. In addition, the transducer transmits ultrasounds, which impinge on the portion of wire/ribbon in contact with the metallization of the die; in this way, by means of pressure and exposure to ultrasounds, there is partial melting of the conductive material that forms the metallization and the wire/ribbon, with consequent formation of the bond.

As has been mentioned, the ribbon bonds enable supply to the dies of particularly high currents; for example, a generic ribbon having a thickness T and a width L respectively equal to ten and eighty mils is able to withstand the same total current that can be conveyed by four round wires with a diameter of fifteen mils. Consequently, the ribbon bonds enable simplification of the electrical connections between dies and connection terminals. However, the ribbon bonds, and in particular the geometrical dimensions of the ribbons, should respect the geometrical constraints imposed by the bonding machines, with consequent limitation of the benefits that can be achieved adopting said type of bonding.

SUMMARY OF THE INVENTION

An aim of and embodiment is to provide an electronic device and a method for connecting a die to a connection terminal that will enable the drawbacks of the known art to be at least partially overcome.

An aim of an embodiment is to provide an electronic device and a method for connecting a die to a connection terminal that will enable the drawbacks of the known art to be at least partially overcome.

According to an embodiment, an electronic device for connecting a die to a connection terminal is provided, comprising: a die-pad area; a die, fixed to said die-pad area; a connection terminal; and a ribbon of conductive material, said ribbon being electrically connected to said die and to said connection terminal, and having a prevalent dimension along a first axis, a width, measured along a second axis, which is transverse to said first axis, and a thickness, said thickness being negligible with respect to said width; said ribbon moreover having a cross section defining a concave geometrical shape.

According to an embodiment, a method for connecting a die to a connection terminal is provided, comprising a connection terminal, comprising the steps of: providing a die-pad area; fixing a die on said die-pad area; electrically connecting said die to a connection terminal with a ribbon of conductive material; said ribbon having a prevalent dimension along a first axis, a width, measured along a second axis, which is transverse to said first axis, and a thickness, said thickness being negligible with respect to said width; said ribbon moreover having a cross section defining a concave geometrical shape.

BRIEF DESCRIPTION OF THE DRAWINGS

For a better understanding, embodiments are now described, purely by way of non-limiting example and with reference to the attached drawings, wherein.

DETAILED DESCRIPTION

Given a generic die, one embodiment of the present method envisages connection of the generic die to a connection terminal by means of a ribbon 30 made of metal material (for example, aluminum) and having a cross section of a shape different from the rectangular shape. For example, the ribbon 30 can have alternatively the first cross section, the second cross section, or the third cross section, illustrated respectively in FIGS. 4, 6, and 7 and described in what follows, with reference to the case in which the ribbon 30 has a thickness $T_{30}$.

Figure 4:
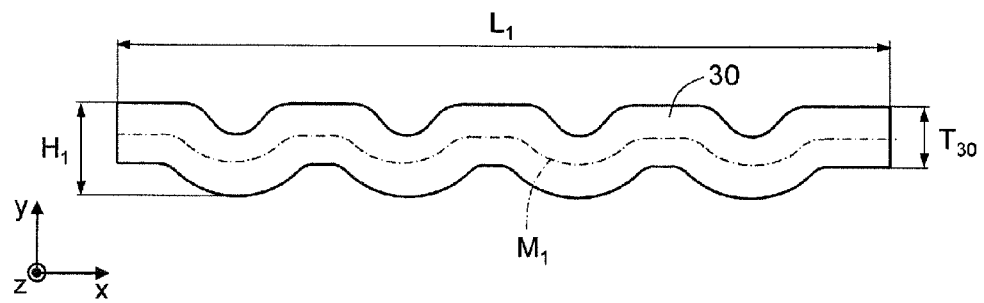
FIGS. 4, 6 and 7 show cross sections of ribbons according to an embodiment of the present method.

In detail, the first cross section, illustrated in FIG. 4, has an undulated shape. In particular, assuming a reference system x, y, z, and assuming that the ribbon 30 extends with a certain length along the axis z, the first cross section lies in the plane defined by the axes x, y, and has a first geometrical shape.

In particular, the first geometrical shape has a first width $L_1$, measured along the axis x, a first height $H_1$, measured along the axis y and greater than the thickness $T_{30}$ of the ribbon 30, and a first area $A_1$. In addition, the first geometrical shape has a first effective width $L_{\mathit{eff}1}$, understood as the length of a hypothetical first center line $M_1$ of the first geometrical shape itself. By way of clarification, the aforementioned first center line $M_1$ is the line the points of which are each at the same distance from a respective pair of points, obtained as intersection of the perimeter of the first geometrical shape with a straight line that is parallel to the axis y and passes through the points themselves.

In greater detail, by sectioning the first geometrical shape in any point of the first geometrical shape itself, and with a straight line perpendicular, in said any point, to the first geometrical shape, a segment is obtained having a length equal to the thickness $T_{30}$. In addition, assuming that the axis x and the axis y define a corresponding Cartesian plane, the first height $H_1$ of the first geometrical shape is equal to the difference between the maximum ordinate and the minimum ordinate that can be assumed by points that form the perimeter of the first geometrical shape. In practice, the first height $H_1$ represents a sort of thickness of encumbrance; i.e., it represents the height of the smallest rectangle that can enclose exactly the first geometrical shape, said rectangle having a base as long as the first width $L_1$, which defines a sort of transverse extension of the first section. In turn, with reference to the aforementioned Cartesian plane, the first width $L_1$ is equal to the difference between the maximum abscissa and the minimum abscissa that can be assumed by points that form the perimeter of the first geometrical shape.

As regards the first area $A_1$, we have $A_1 = L_{eff1} \cdot T_{30}$. Since the first effective width $L_{eff1}$ is greater than the first width $L_1$, the first area $A_1$ of the first cross section is greater than the area A of a corresponding standard cross section (not shown), i.e., a cross section of a ribbon of a known type, hence of a rectangular shape, having a width equal to the first width $L_1$ and a thickness equal to the thickness $T_{30}$ of the ribbon 30.

In other words, assuming, for example, that the first width $L_1$ is equal 2.032 mm, and hence equal to the width of a ribbon of a known type, which can be used inside bonding machines that can be employed for obtaining also wire bonds, the first area $A_1$ of the first cross section is greater than the area of the corresponding standard cross section, albeit having the same width. Consequently, it is possible to use the ribbon 30 within current bonding machines, and moreover the first cross section can be traversed, without the ribbon 30 melting, by a current having a value greater than the maximum current value that could traverse the corresponding standard cross section, as described hereinafter.

Figure 5:
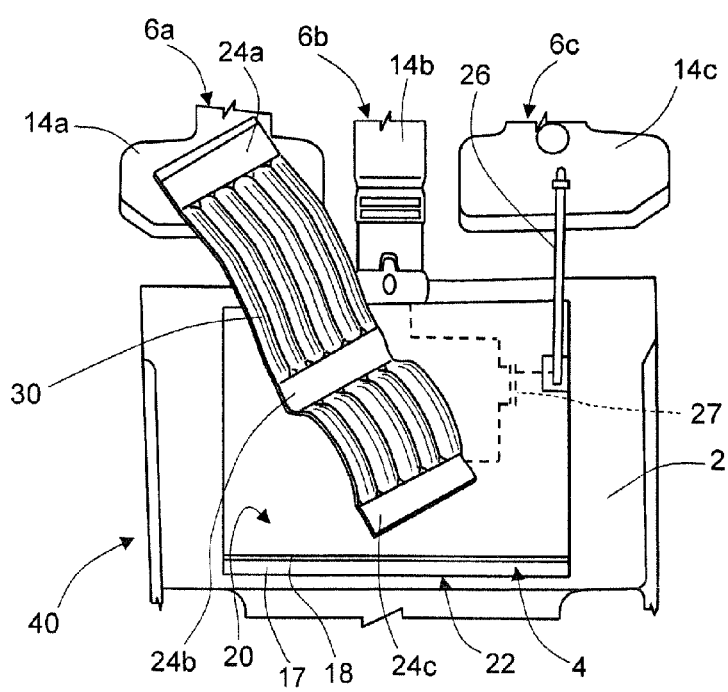
FIG. 5 shows a perspective view of a portion of an electronic device.

By way of example, FIG. 5 shows an electronic device 40, described hereinafter, the present description being limited to the differences alone of the electronic device 40 with respect to the electronic device 15 shown in FIG. 2. In addition, components of the electronic device 40 already present in the electronic device 15 are designated in the same way, except where otherwise specified.

In detail, the electronic device 40 comprises, among other things, the die 4 and the first connection terminal 14a, which are electrically connected by means of the ribbon 30, which is precisely bonded both to the first connection terminal 14a and to the die 4, respectively at the first contact portion 24a, and second and third contact portions 24b, 24c. In particular, at the second and third contact portions 24b, 24c, the ribbon 30 is in contact with the metallization 18 of the die 4. In a way in itself known, the metallization 18 can electrically coincide with a conduction terminal of an electronic circuit formed inside the die 4.

Figure 1:
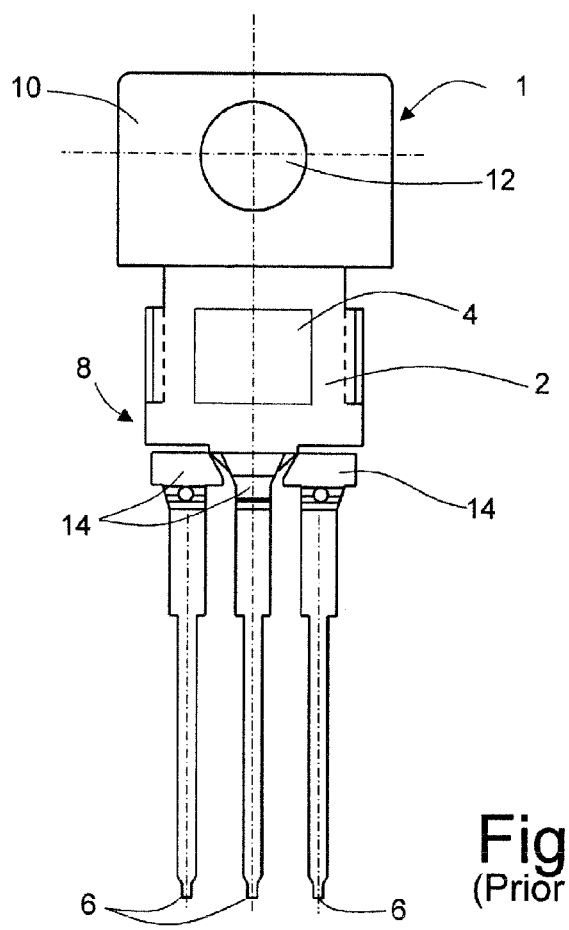
FIG. 1 shows a view of a package.
Figure 2:
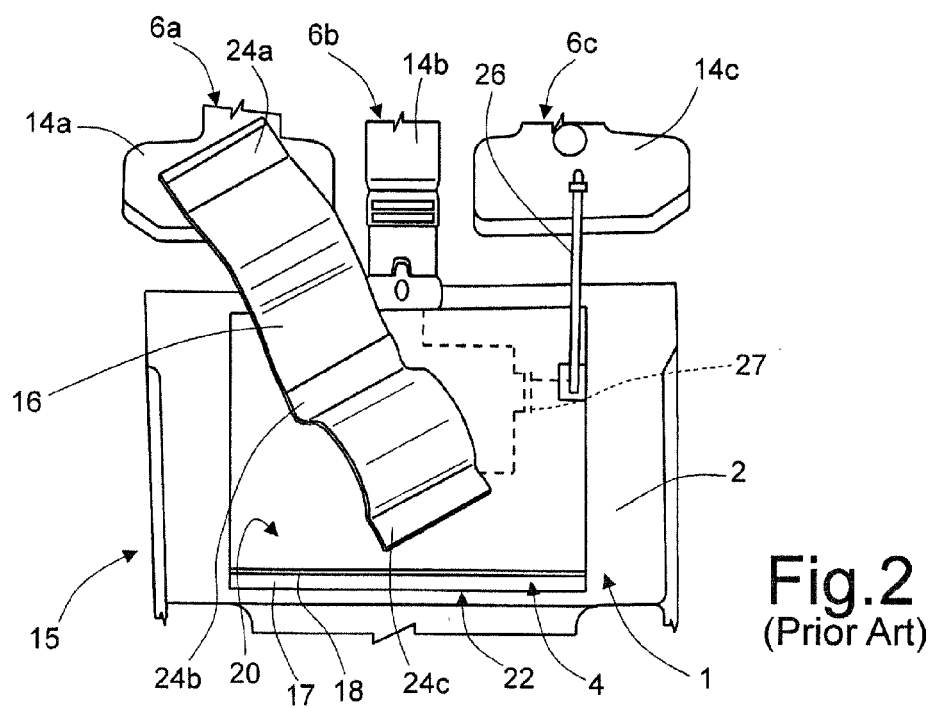
FIG. 2 shows a perspective view of a portion of an electronic device of a known type.
Figure 3:
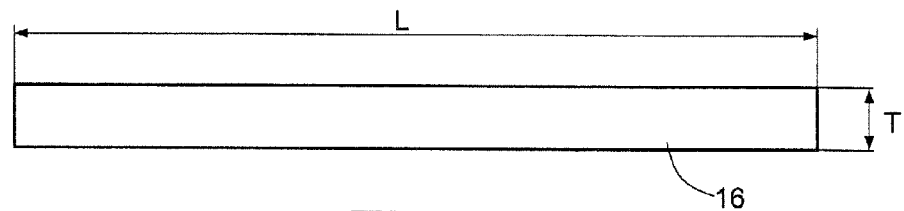
FIG. 3 shows a cross section of a ribbon of a known type.

In practice, both the ribbon 16 shown in FIG. 2 and the ribbon 30 can be bonded using common bonding machines. However, assuming that the width L and the thickness T of the ribbon 16 are respectively equal to the first width $L_1$ and to the thickness $T_{30}$ of the ribbon 30, and if $I_{max}$ designates the maximum current that can traverse the ribbon 16 without the ribbon 16 melting, the ribbon 30 can be traversed, without melting, by a current $I_{max1}$ greater than the maximum current $I_{max}$. In fact, as has been mentioned previously, even though the first cross section and the corresponding standard cross section have one and the same width, the first area $A_1$ of the first cross section is greater than the area of the corresponding standard cross section, which, given the hypotheses, coincides with the cross section of the ribbon 16.

Inside the die 4 of the electronic device 40 there can hence be provided an electronic power component, such as, for example, the power MOSFET 27; by means of the ribbon 30 it is in fact possible to supply to the electronic power component currents having intensities of up to $I_{max1}$.

Figure 6:
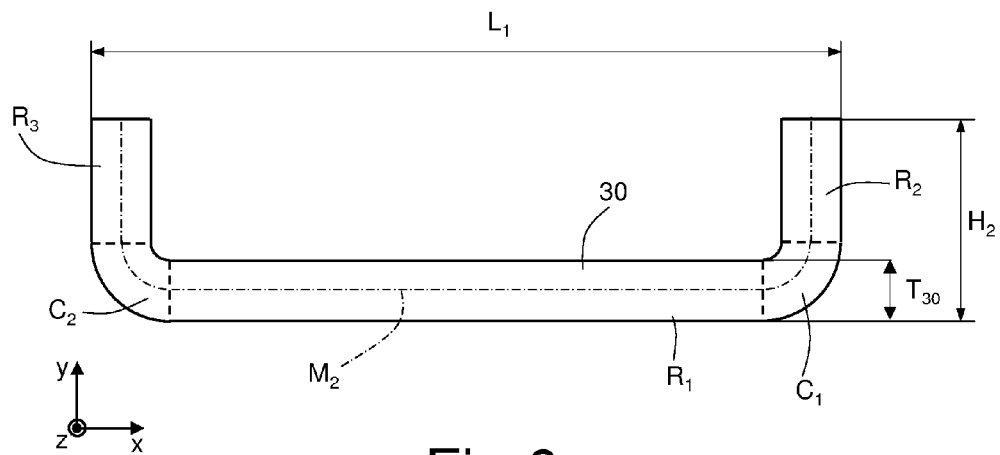

As has been mentioned previously, the ribbon 30 can have, instead of the first cross section, the second cross section, illustrated in FIG. 6. In detail, the second cross section has a second geometrical shape, which is a shape of a "C" type (equivalently, a "U" shape); hence, it is possible to obtain joining of a first rectangular area $R_1$ with a second rectangular area $R_2$ and a third rectangular area $R_3$ that are the same as one another and set perpendicular to the first rectangular area $R_1$, respectively by means of a first portion of annulus $C_1$ and a second portion of annulus $C_2$.

Without any loss of generality, the second geometrical shape can have the same first width $L_1$ as that of the first cross section, measured once again along the axis x and equal, with reference to the aforementioned Cartesian plane, to the difference between the maximum abscissa and the minimum abscissa that can be assumed by points that form the perimeter of the second geometrical shape itself. In addition, the second geometrical shape has a second height $H_2$, measured along the axis y and greater than the thickness $T_{30}$ of the ribbon 30, and a second area $A_2$. Again, the second geometrical shape has a second effective width $L_{eff2}$, understood as the length of a hypothetical second center line $M_2$ of the same second geometrical shape, and such that the relation $A_2 = L_{eff2} \cdot T_{30}$ applies.

In greater detail, and with reference to the aforementioned Cartesian plane, the second height $H_2$ is equal to the difference between the maximum ordinate and the minimum ordinate that can be assumed by points that form the perimeter of the second geometrical shape. In practice, the second height $H_2$ represents a sort of thickness of encumbrance; i.e., it represents the height of the smallest rectangle that can enclose exactly the second geometrical shape, said rectangle having a base as long as the first width $L_1$.

In a way similar to what has been described as regards the first cross section, since the second effective width $L_{eff2}$ is greater than the first width $L_1$, the second area $A_2$ of the second geometrical shape is greater than the area of the corresponding standard cross section. Consequently, there apply the same considerations in terms of possibilities of use within bonding machines that can be employed for providing also wire bonds, as well as in terms of maximum current value.

Figure 7:
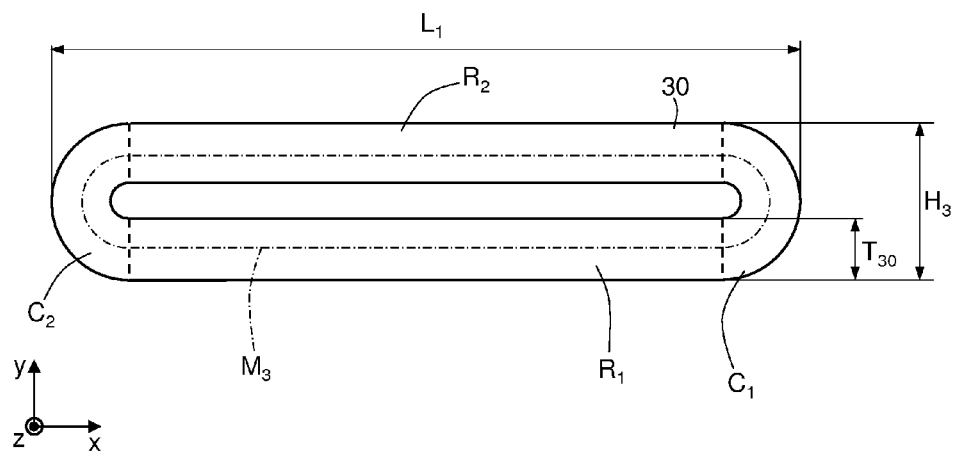

As has been mentioned previously, the ribbon 30 can have, instead of the first and second cross sections, the third cross section, illustrated in FIG. 7. In detail, the third cross section has a third geometrical shape, which is a closed shape and is not simply connected (in other words, it is hollow), and is formed by the first and second rectangular areas $R_1$, $R_2$, as well as by the first and second portions of annulus $C_1$, $C_2$, which radius the first and second rectangular areas $R_1$, $R_2$ together.

In particular, the first and second rectangular areas $R_1$, $R_2$ are the same as one another. In addition, the first and second rectangular areas $R_1$, $R_2$ are set in such a way that the respective longer sides are set parallel to the axis x, and in such a way that the respective geometrical centers are aligned along the axis y. Instead, the first and second portions of annulus $C_1$, $C_2$ are formed, each, by a corresponding half annulus.

Without loss of generality, the third geometrical shape can have the same first width $L_1$ as the first cross section, measured once again along the axis x and equal, with reference to the aforementioned Cartesian plane, to the difference between the maximum abscissa and the minimum abscissa that can be assumed by points that form the perimeter of the third geometrical shape itself. In addition, the third geometrical shape has a third height $H_3$, measured along the axis y and greater than the thickness $T_{30}$ of the ribbon 30, and a third area $A_3$. Once again, the third geometrical shape has a third effective width $L_{eff3}$, understood as the length of a hypothetical third center line $M_3$ of the third geometrical shape, and such that the relation $A_3 = L_{eff3} \cdot T_{30}$ applies.

In greater detail, and with reference to the aforementioned Cartesian plane, the third height $H_3$ is equal to the difference between the maximum ordinate and the minimum ordinate that can be assumed by points that form the perimeter of the third geometrical shape. In practice, the third height $H_3$ represents a sort of thickness of encumbrance; i.e., it represents the height of the smallest rectangle that can enclose exactly the third geometrical shape, said rectangle having a base longer than the first width $L_1$.

In a way similar to what has been described as regards the first and second cross sections, since the third effective width $L_{eff3}$ is greater than the first width $L_1$, the third area $A_3$ of the third geometrical shape is greater than the area of the corresponding standard cross section. There consequently apply the same considerations in terms of possibilities of use within bonding machines that can be employed for providing also wire bonds, as well as in terms of maximum current intensity.

In practice, it is possible to consider the first, second, and third cross sections as cross sections of a hypothetical ribbon obtained starting from a sheet of metal material, having initially the shape of a parallelepiped with a width $L_x$ (with $L_x > L_1$) and thickness $T_{30}$ (the length is not relevant), and subsequently folded in such a way that the resulting geometrical shape has a width equal to the first width $L_1$. This can be obtained by means of a partial curvature of the sheet of metal material. In addition, the width $L_x$ coincides alternatively with the first effective width $L_{eff1}$, the second effective width $L_{eff2}$, or the third effective width $L_{eff3}$, according to whether the ribbon 30 has effectively the first cross section, the second cross section, or the third cross section.

In general, it may in any case be hypothesized that the ribbon 30 has a cross section again different from the first, second, and third cross sections described, provided that the cross section has a geometrical shape the area of which is greater than the area of the cross section of the corresponding standard cross section. This occurs when the ribbon 30 has a cross section that defines a concave geometrical shape, i.e., if there exists at least one segment that connects two points of said geometrical shape and that extends at least in part outside the geometrical shape itself.

The advantages that the present electronic device and the present method afford emerge clearly from the foregoing discussion. In particular, the present method enables increase in the maximum current that can traverse the ribbon bonds, without entailing the need to adopting bonding machines different from the bonding machines commonly used for providing wire bonds.

In addition, the ribbon 30 described has a cross section having an area increased as compared to ribbons of a known type; said cross section is hence characterized by a high moment of inertia. The ribbon 30 is hence characterized, as compared to known ribbons, by better mechanical performance, for example in terms of greater resistance to vibrations; consequently, the adoption of the ribbon 30 enables simplification of the design and creation of the so-called "loop", i.e., the portion of ribbon 30 present between the second and third contact surfaces 24b, 24c.

Finally, it is evident that modifications and variations may be made to the present method and electronic device described herein, without thereby departing from the scope of the present invention.

In particular, as mentioned previously, it is possible for the ribbon 30 to have a cross section different from what has been described and illustrated previously.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An electronic device comprising:
   a die-pad area;
   a die, fixed to said die-pad area;
   a connection terminal; and
   a ribbon of conductive material, said ribbon being electrically connected to said die and to said connection terminal, and having a prevalent dimension along a first axis, a width along a second axis transverse to said first axis, and a thickness along a third axis, said thickness being negligible with respect to said width; wherein said ribbon has a cross section defining a concave geometrical shape, and wherein said cross section is perpendicular to said first axis.

2. The electronic device according to claim 1, wherein said geometrical shape has an area greater than the product of said width and said thickness.

3. The electronic device according to claim 1, wherein said geometrical shape is undulated.

4. The electronic device according to claim 1, wherein said geometrical shape is like a "C" or a "U".

5. The electronic device according to claim 1, wherein said geometrical shape is closed and hollow.

6. The electronic device according to claim 1, wherein said die forms an electronic power device, such as a power MOSFET or a diode.

7. The electronic device according to claim 6, wherein said ribbon is electrically connected to a conduction terminal of said electronic power device.

8. The electronic device according to claim 1, wherein said first, second, and third axes are mutually orthogonal.

9. A method for connecting a die to a connection terminal, comprising the steps of:
   providing a die-pad area;
   fixing a die on said die-pad area; and
   electrically connecting said die to a connection terminal with a ribbon of conductive material, said ribbon having a prevalent dimension along a first axis, a width along a second axis transverse to said first axis, and a thickness along a third axis, said thickness being negligible with respect to said width; wherein said ribbon has a cross section defining a concave geometrical shape, and wherein said cross section is perpendicular to said first axis.

10. The method of connection according to claim 9, wherein said geometrical shape has an area greater than the product of said width and said thickness.

11. The method of connection according to claim 9, wherein said geometrical shape is undulated.

12. The method of connection according to claim 9, wherein said geometrical shape is like a C or a U.

13. The method of connection according to claim 9, wherein said geometrical shape is closed and hollow.

14. A ribbon bond comprising:
    a first contact portion;
    a second contact portion; and
    a first ribbon of conductive material extending between the first contact portion and the second contact portion, wherein a cross-section of the first ribbon that is substantially perpendicular to an axis extending between the first contact portion and the second contact portion comprises an effective width that is greater than a width of the first ribbon.

15. The ribbon bond of claim 14, wherein the effective width of the first ribbon is related to a maximum current the first ribbon is capable of carrying without melting.

16. The ribbon bond of claim 14, wherein an area of the cross-section of the first ribbon is approximately equal to the effective width multiplied by a thickness of the first ribbon.

17. The ribbon bond of claim 16, wherein the area is greater than the width multiplied by the thickness.

18. The ribbon bond of claim 14, wherein a thickness of the first ribbon is negligible with respect to the width.

19. The ribbon bond of claim 14, wherein the cross-section of the first ribbon has a concave geometrical shape.

20. The ribbon bond of claim 14, wherein the cross-section of the first ribbon has a shape that is undulated.

21. The ribbon bond of claim 14, wherein the cross section of the first ribbon has a shape that is closed and hollow.

22. The ribbon bond of claim 14 further comprising a third contact portion and a second ribbon extending between the second contact portion and the third contact portion.

23. A ribbon bond comprising:
a first contact portion;
a second contact portion; and
a first ribbon of conductive material extending between the first contact portion and the second contact portion, wherein a cross-section of the first ribbon that is substantially perpendicular to an axis extending between the first contact portion and the second contact portion comprises a height that is greater than a thickness of the first ribbon.

24. The ribbon bond of claim 23, wherein the height of the first ribbon is related to a maximum current the ribbon is capable of carrying without melting.

25. The ribbon bond of claim 23, wherein the cross-section of the first ribbon has a concave geometrical shape.

26. The ribbon bond of claim 23, wherein the cross-section of the first ribbon has a shape that is undulated.

27. The ribbon bond of claim 23, wherein the cross section of the first ribbon has a shape that is closed and hollow.

28. The ribbon bond of claim 23 further comprising a third contact portion and a second ribbon extending between the second contact portion and the third contact portion.

* * * * *